US009807825B2

(12) United States Patent
Van De Ven

(10) Patent No.: US 9,807,825 B2
(45) Date of Patent: Oct. 31, 2017

(54) SOLID STATE LIGHTING DEVICES UTILIZING MEMRISTORS

(75) Inventor: Antony Paul Van De Ven, Sai Kung (HK)

(73) Assignee: CREE, INC., Durham, NC (US)

( * ) Notice: Subject to any disclaimer, the term of this patent is extended or adjusted under 35 U.S.C. 154(b) by 654 days.

(21) Appl. No.: 12/782,374

(22) Filed: May 18, 2010

(65) Prior Publication Data

US 2011/0285309 A1 Nov. 24, 2011

(51) Int. Cl.
*H03H 7/06* (2006.01)
*H01L 45/00* (2006.01)
*H05B 33/08* (2006.01)
*F21Y 115/10* (2016.01)

(52) U.S. Cl.
CPC ..... *H05B 33/0809* (2013.01); *H05B 33/0872* (2013.01); *F21Y 2115/10* (2016.08)

(58) Field of Classification Search
None
See application file for complete search history.

(56) References Cited

U.S. PATENT DOCUMENTS 6,577,073 B2* 6/2003 Shimizu et al. .............. 315/246
7,213,940 B1 5/2007 Van De Ven et al. ......... 362/231
7,453,053 B2* 11/2008 Lee ............................... 250/205
8,643,283 B2* 2/2014 Brandes ......................... 315/122
8,767,449 B2* 7/2014 Pickett .................... G11C 11/39 365/148
2003/0148545 A1* 8/2003 Zhuang et al. ................... 438/3
2006/0091826 A1 5/2006 Chen
2007/0200512 A1 8/2007 Gotou
2008/0307151 A1 12/2008 Mouttet
2009/0050904 A1* 2/2009 Hsieh et al. .................... 257/79
2010/0051976 A1* 3/2010 Rooymans ...................... 257/89
2010/0109656 A1 5/2010 Wang
2010/0122976 A1* 5/2010 Kim et al. .................... 219/501
2010/0148672 A1* 6/2010 Hopper ......................... 315/113
2010/0264397 A1* 10/2010 Xia ....................... H01L 27/101 257/4

(Continued)

FOREIGN PATENT DOCUMENTS

EP 1 460 637 A1 9/2004
EP 1 881 743 A2 3/2008
EP 1 901 587 A2 3/2008

OTHER PUBLICATIONS

HP Labs, HP Labs Proves Existence of New Basic Element for Electronic Circuits, Apr. 30, 2008.*

(Continued)

*Primary Examiner* — Dedei K Hammond
(74) *Attorney, Agent, or Firm* — Koppel, Patrick, Heybl & Philpott

(57) ABSTRACT

LED chip circuits, solid state light engines and SSL luminaires are disclosed that utilize memristors to vary LED chip emission. In different embodiments the resistance of said memristor can be varied to vary the drive signal applied to one or more LED chips, thereby varying the LED chip emission intensity. The present invention can be used in much different arrangement to vary LED chip emission, such as changing the drive signals to LED chips that experience changes in emission intensity at different temperatures or that experience emission intensity depreciation over time.

36 Claims, 4 Drawing Sheets

(56) References Cited

U.S. PATENT DOCUMENTS

2012/0132880 A1* 5/2012 Bratkovski ........ G11C 13/0007 257/3

OTHER PUBLICATIONS

Zakhidov et al., Organic Electronics, A light-emitter memristor, pp. 150-153, May 2009.*

Zakhidov et al., "Organic Electronics, A light-emitting memristor" 2010, p. 151, Figure 1A.*

International Search Report and Written Opinion for counterpart PCT Application No. PCT/US2011/00821 dated Oct. 31, 2011.

Zakhidov A. A., et al., "A Light-Emitting Memristor", Organic Electronics, Elsevier, Amsterdam, NL, vol. 11, No. 1, Jan. 1, 2010, pp. 150-153.

Sangho Shin et al., "Memristor-based Fine Resolution Programmable Resistance and its Applications", Circuits and Systems, 2009. ICCCAS 2009. International Conference on IEEE, Piscataway, NJ, USA, Jul. 23, 2009, pp. 948-951.

L. Chua: "Memristor—The Missing Circuit Element", IEEE Transactions on Circuit Theory, vol. 18, No. 5, Jan. 1, 1971, pp. 507-519.

U.S. Appl. No. 11/656,759, filed Jan. 22, 2007 entitled "Wafer Level Phosphor Coating Method and Devices Fabricated Utilizing Method."

U.S. Appl. No. 11/899,790, filed Sep. 7, 2007, entitled "Wafer Level Phosphor Coating Method and Devices Fabricated Utilizing Method."

U.S. Appl. No. 11/473,089, filed Jun. 21, 2006, entitled "Close Loop Electrophoretic Deposition of Semiconductor Devcies."

* cited by examiner

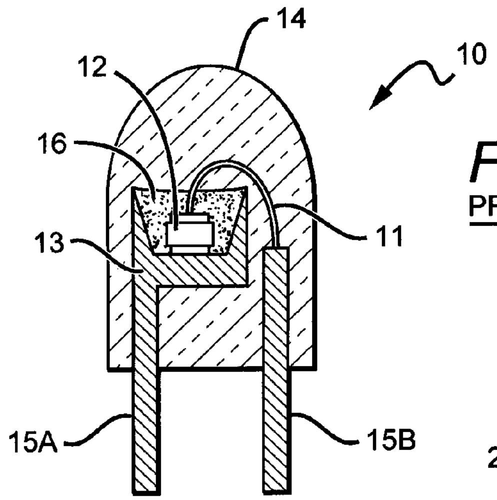
FIG. 1
PRIOR ART
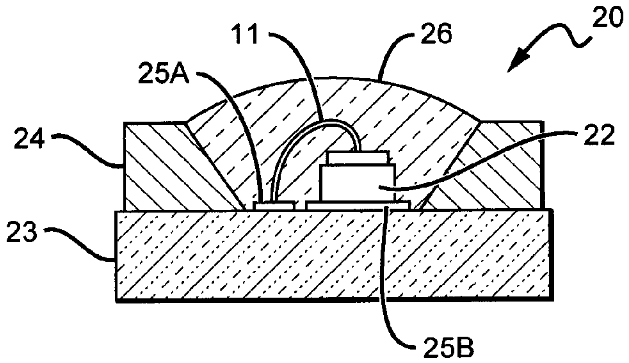
FIG. 2
PRIOR ART
FIG. 3
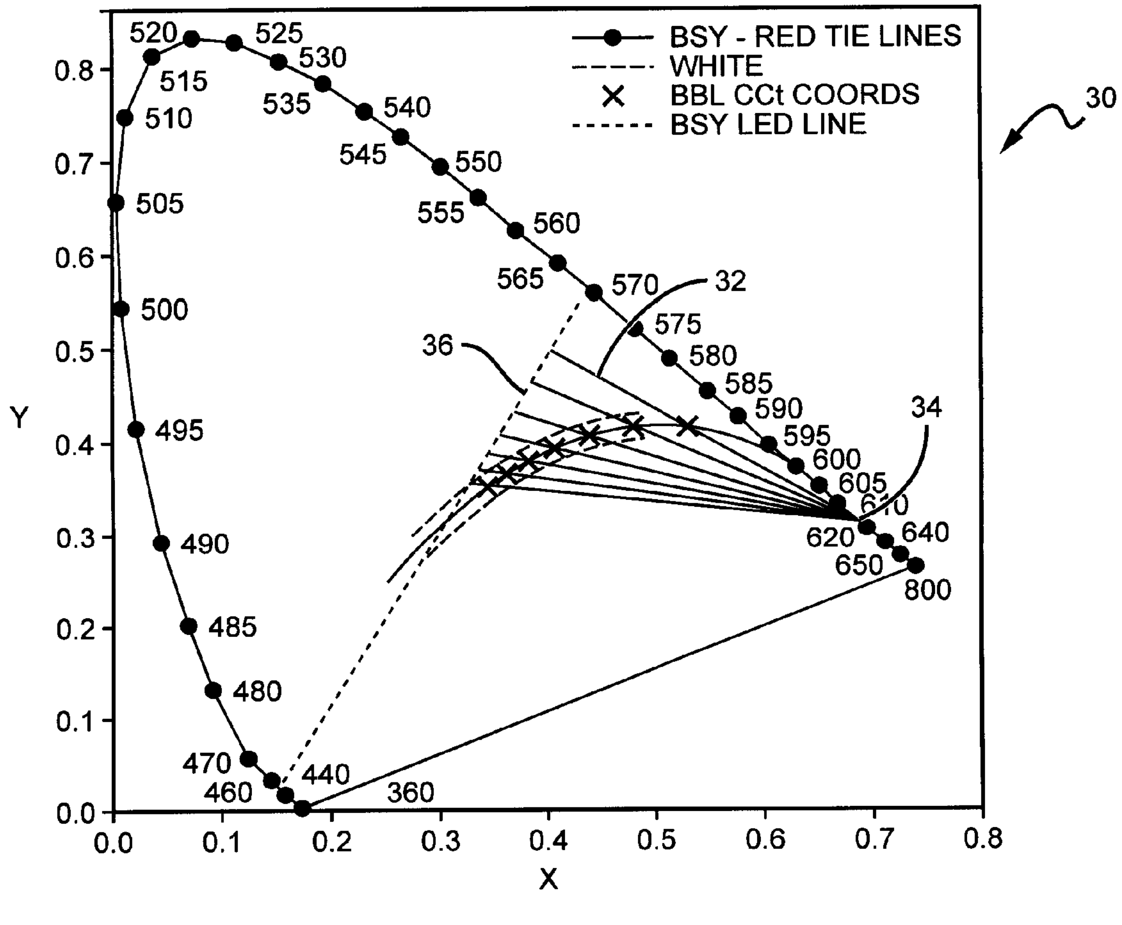

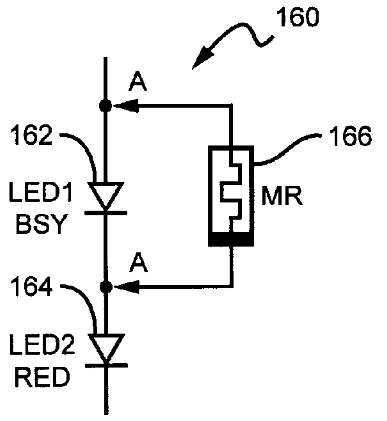
FIG. 9
FIG. 10
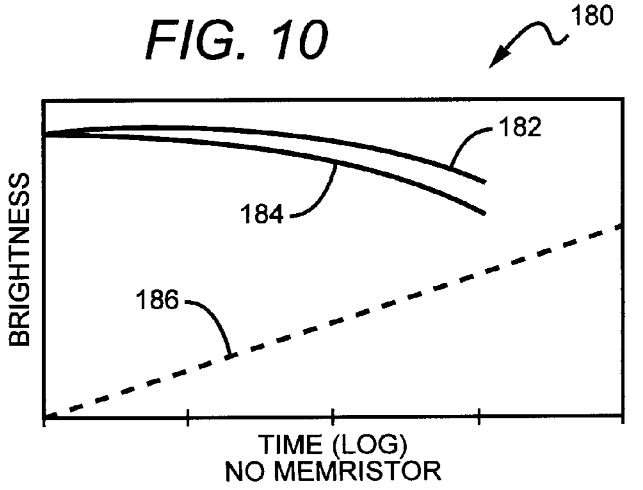
FIG. 11
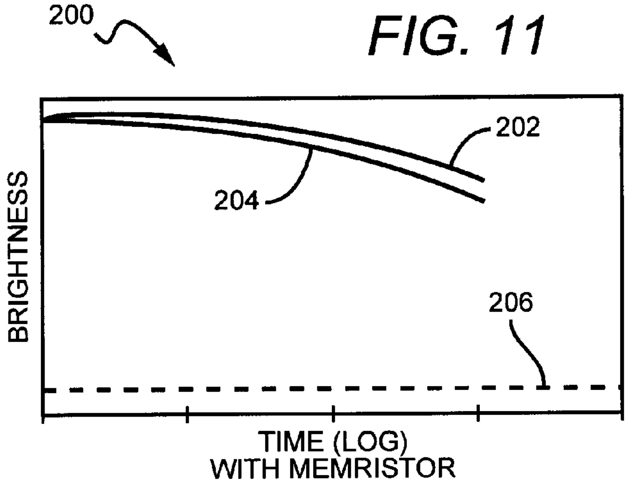
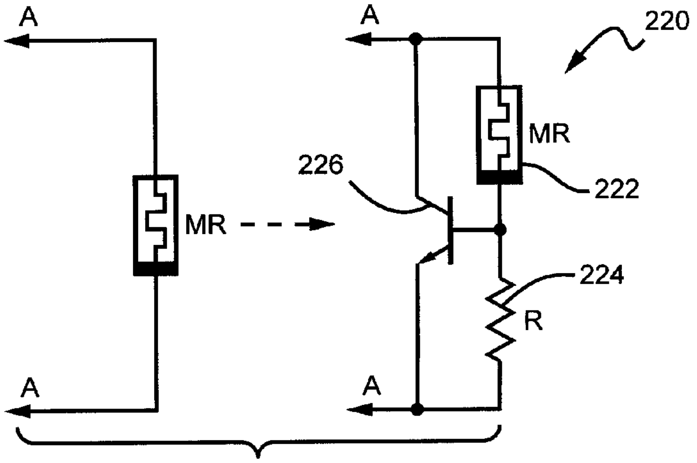
FIG. 12

SOLID STATE LIGHTING DEVICES UTILIZING MEMRISTORS

BACKGROUND OF THE INVENTION

Field of the Invention

This invention relates to LED chip circuits, solid state light engines and SSL luminaires utilizing memristors. In some embodiments the memristors can be used to adjust the drive signals to solid state emitters.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips and LED packages, such as those shown in FIGS. 1 and 2, are more commonly being used for lighting applications that were previously the domain of incandescent or fluorescent lighting. The LEDs and LED packages can be arranged as the light source in SSL luminaries or lamps and single or multiple LEDs or LED packages can be used. The general acceptance of these luminaries has accelerated with the improvement in LED emission efficiency and quality. LEDs have been demonstrated that can produce white light with an efficiency of greater than 150 L/W, and LEDs are expected to be the predominant commercially utilized lighting devices within the next decade.

SSL luminaires have been developed that utilize a plurality of LED chips or LED packages, with at least some being coated by a conversion material so that the combination of all the LED chips or packages produces the desired wavelength of white light. Some of these include blue emitting LEDs covered by a conversion material such as YAG:CE or Bose, and blue or UV LEDs covered by RGB phosphors. These have resulted in luminaires with generally good efficacy, but only medium CRI. These luminaires typically have not been able to demonstrate both the desirable high CRI and high efficacy, especially with color temperatures between 2700K and 4000K.

Techniques for generating white light from a plurality of discrete light sources to provide improved CRI at the desired color temperature have been developed that utilize different hues from different discrete light sources. Such techniques are described in U.S. Pat. No. 7,213,940, entitled "Lighting Device and Lighting Method". In one such arrangement a 452 nm peak blue InGaN LEDs were coated with a yellow conversion material, such as a YAG:Ce phosphor, to provide a color that was distinctly yellow and has a color point that fell well above the black body locus on the CIE diagram. Blue emitting LEDs coated by yellow or green conversion materials are often referred to as blue shifted yellow (BSY) LEDs or LED chips. The BSY emission is combined with the light from reddish AlInGaP LEDs that "pulls" the yellow color of the yellow LEDs to the black body curve to produce warm white light. FIG. 3 shows a CIE diagram 30 with the tie lines 32 between red light 34 from red emitting LEDs and various yellow and yellowish points from different BSY emitters 36. With this approach, high efficacy warm white light with improved CRI can be generated. Some embodiments exhibited improved efficacy, with CRI Ra of greater than 90 at color temperatures below 3500 K.

This technique for generating warm white light generally comprises mixing blue, yellow and red photons (or lighting components) to reach color temperature of below 3500K. The blue and yellow photons can be provided by a blue emitting LED covered by a yellow phosphor. The yellow photons are produced by the yellow phosphor absorbing some of the blue light and re-emitting yellow light, and the blue photons are provided by a portion of the blue light from the LED passing through the phosphor without being absorbed. The red photons are typically provided by red emitting LEDs, including reddish AlInGaP LEDs. Red LEDs from these materials can be temperature sensitive such that they can exhibit significant color shift and efficiency loss with increased temperature. This can result in luminaires using these LEDs emitting different colors of light different temperatures.

The emission efficacy or intensity of different types of emitters can also reduce or depreciate over time, and for different types, the rate of depreciation can be different. For example, the emission intensity of red AlInGaP LEDs can depreciate over time at a higher rate than other LEDs such as BSY LEDs. SSL luminaires using these different types of LEDs to produce a combined light with the desired emission characteristics can experience a color shift over time as a result of the red LED emission depreciation.

One way to reduce the color shift caused by temperature and time related color efficiency loss or depreciation is to include additional compensation circuitry with the SSL luminaire that can vary the drive signal applied to the LEDs. This, however, can increase the cost and complexity of the luminaires.

SUMMARY OF THE INVENTION

The present invention is directed to LED chip circuits, solid state light engines and SSL luminaires utilizing memristors. In some embodiments, the memristors can be used to vary LED chip emission in the circuits, light engines or luminaires. In different embodiments, the resistance of the memristor can varied to vary the drive signal applied to one or more LED chips, thereby varying the LED chip emission intensity. The present invention can be used in many different arrangements to vary LED chip emission, such as changing the drive signals to LED chips that experience changes in emission intensity at different temperatures or that experience emission intensity depreciation over time.

One embodiment of an LED chip circuit according to the present invention comprises an LED chip and a memristor arranged to vary the drive signal applied to the LED chip in response to changes in the resistance provided by the memristor.

One embodiment of a solid state luminaire according to the present invention comprising a first LED chip that can experience changes in emission over time or in response to changes in temperature. A memristor is arranged to vary the drive signal applied to the first LED chip to compensate for these emission changes.

One embodiment of a solid state light engine according to the present invention comprises an LED chip array having first LED chips emitting at one color of light and second LED chips emitting a different color of light. The emission of the first and second LED chips can depreciate over time at different rates. A memristor is arranged to vary the drive signal applied to the first LED chips to compensate for the different rates of emission depreciation between the first and second LED chips.

Another embodiment of a solid state luminaire according to the present invention comprises a housing having a housing opening. A light engine is arranged in the housing having an array of LED chips comprising first and second LED chips emitting at different colors of light. The light from the first and second LED chips emits out of the housing opening. A memristor is included to vary the emission at least one of the first and second LED chips.

One embodiment of a solid state lighting device according to the present invention comprises an LED and a memristor that received DC current while the LED is being driven a drive current. A drive circuit is included that provides the drive current, with the drive circuit responsive to the memristor resistance value and varying the drive current to the LED based on the resistance of said memristor.

These and other aspects and advantages of the invention will become apparent from the following detailed description and the accompanying drawings which illustrate by way of example the features of the invention.

BRIEF DESCRIPTION OF THE DRAWINGS

FIG. 1 shows a sectional view of one embodiment of a prior art LED lamp;

FIG. 2 shows a sectional view of another embodiment of a prior art LED lamp;

FIG. 3 is a CIE diagram showing the tie lines between BSY and red emitters;

FIG. 9 is a schematic for another embodiment of an LED chip circuit utilizing a memristor according to the present invention;

FIG. 10 is another graph showing the emission characteristics over time for a conventional LED chip circuit FIG. 11 is a graph showing the emission characteristics for another chip circuit utilizing a memristor according to the present invention; and FIG. 12 is a schematic for another embodiment of an LED chip circuit utilizing a memristor according to the present invention.

DETAILED DESCRIPTION OF THE INVENTION

Figure 4:
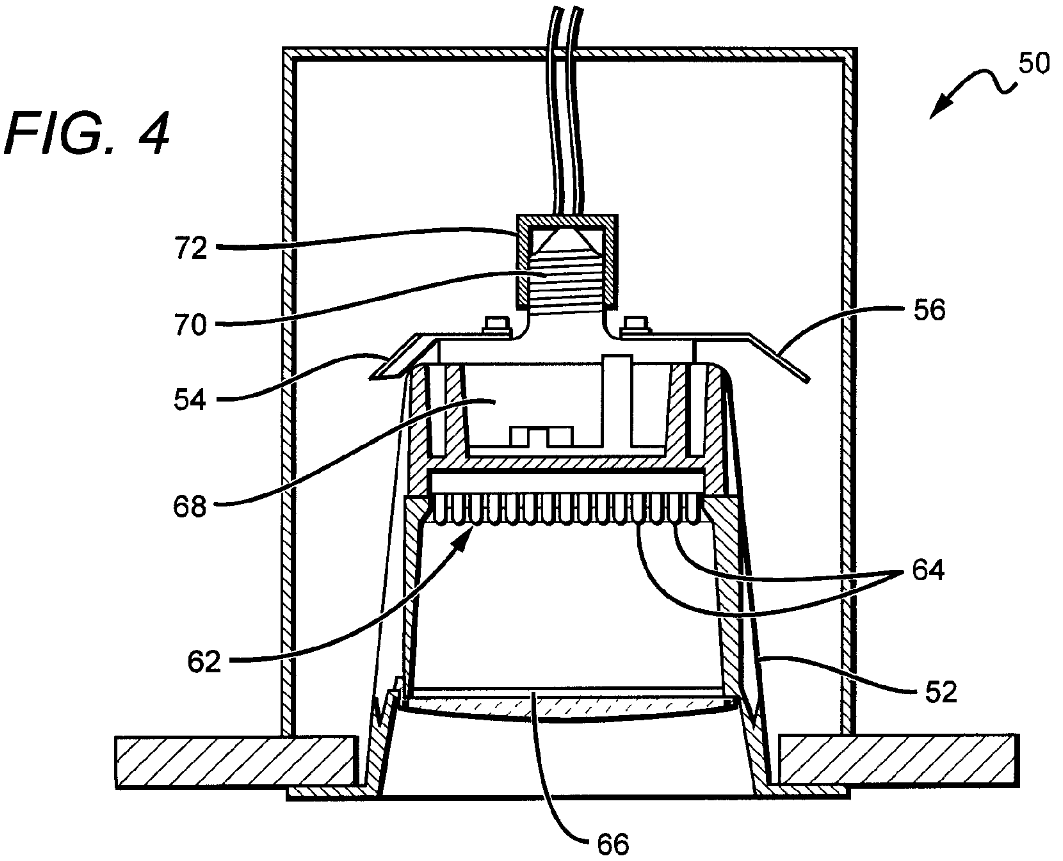
FIG. 4 is a side view of one embodiment of an SSL luminaire according to the present invention.

The present invention is directed to lighting devices using memristors to vary the drive signals applied to the emitters in the lighting device, and in different embodiments the drive signals can be varied for many different reasons. For example, in some embodiments the drive signal can be varied to change the emission provided by the lighting device, such as in SSL luminaires having one or more LED chips as their emitters. The drive signal to one or more of the LED chips can be varied under control of the memristor to increase or decrease the intensity of one or more of the LED chips to change the overall emission of the SSL luminaire. In other embodiments, the drive signal of the LED chips can be varied to compensate for changing emission characteristics of the emitters. In SSL luminaire embodiments one or more LED chips can experience varying emission characteristics at different temperatures or over time. The drive signal to these LED chips can be varied using a memristor to compensate for these changes so that the SSL luminaire maintains substantially the same emission characteristics.

Memristors are time variant two terminal devices where the amount of magnetic flux between the terminals is dependent on the charge that has passed through the terminals. Certain memristors can provide a controllable resistance. If the charge through a memristor does not change, such as when passing an AC current through the device, then the resistance of the device does not change. Thus, a DC current could be applied to the memristor to set its resistance value and then the resistance value could be read using an AC current. In some embodiments, this “memory” of a resistance could be used to set reference voltages that would correspond to current through a string of LED chips to the output of LED chips. Other techniques for tuning LED chip emission using memristors could also be utilized, such as using the memristor for current limiting and driving the LED chips with AC.

The memristor can adjust the LED chip’s drive signal so that the current through the LEDs can be adjusted over time, allowing for simple and inexpensive long term color maintenance when different LEDs are combined in a single SSL luminaire device or fixture. In some embodiments, the current could be controlled for one or more red LEDs, such as AlInGaP LEDs, so that the red LEDs maintain the desired brightness with temperature over the life of the SSL, device or fixture. The current through these LEDs can also be controlled to maintain the desired brightness with emission depreciation over time.

The present invention is described herein with reference to certain embodiments, but it is understood that the invention can be embodied in many different forms and should not be construed as limited to the embodiments set forth herein. In particular, the present invention is described below in regards to certain SSL luminaires having LED chips in different configurations, such as in LED arrays. These are generally referred to as SSL luminaires, but it is understood that the present invention can be used for many other lamps or lighting applications having many different array configurations of different emitter types. The luminaires and its components can have different shapes and sizes beyond those shown and different numbers of LED chips can be included in the luminaires. For luminaires using arrays of LEDs, some or all of the LED chips in the arrays can be coated with a conversion material that can comprise a phosphor loaded binder ("phosphor/binder coating"), but it is understood that LEDs without a conversion material can also be used. The present invention is described below with reference to certain embodiments where the drive signals to the LED chips are varied for certain reasons. It is understood, however, that the drive signals to LED chips can be varied for many other reasons using memristors according to the present invention, and the embodiments below should not be considered as limiting.

The luminaires according to the present invention are described as using arrays of LED chips as their light source, but it is also understood that these can also include LEDs and LED packages. Many different arrangements of LEDs, LED chips or LED packages can be combined in the SSL luminaires according to the present invention, and hybrid or discrete solid state lighting elements can be used to provide the desired combination of lighting characteristics. For ease of description the emitters in the SSL luminaires below are described as using "LED chips", but it is understood that they can include any of the emitter types described herein.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, and/or sections, these elements, components, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional or schematic view illustrations that are schematic illustrations of embodiments of the invention. As such, the actual size, orientation and arrangement of the different features and elements may be different, and variations from the shapes of the illustrations as a result, for example, of manufacturing techniques and/or tolerances are expected. Embodiments of the invention should not be construed as limited to the particular shapes or arrangement of the features shown but are to include deviations in shapes that result, for example, from manufacturing. Thus, the features illustrated in the figures are schematic in nature and their shape, size or orientation are not intended to limit the scope of the invention.

It is understood that the arrangements described herein can be utilized in many different SSL luminaires having different features arranged in different ways. FIG. 4 shows just one embodiment of an SSL luminaire 50 according to the present invention that can comprise a plurality of LED chips arranged as its light source according to the present invention. The luminaire 50 generally comprises a housing 52 that can be mounted in place in a fixture, wall or ceiling using many different mounting mechanisms. In the embodiment shown, the mounting mechanisms comprise a first mounting clip 54, a second mounting clip 56, and a third mounting clip (not visible in FIG. 4). A light engine 62 is arranged in the housing 52 and comprises a plurality of LED chips 64 mounted so that light from the LED chips is directed out the opening of the housing 52 and the emission of the LED chips 64 combines to produce the desired emission characteristics of the luminaire 50. A diffuser 66 can be included over the housing opening, and a power supply/converter 68 is included. The housing 52 can also comprise an electrical connection region 70 which is engageable with an electricity supply device 72 (in this embodiment, an Edison socket).

The power supply/converter 68 can also be positioned within the housing and can comprise a conventional rectifier and high voltage converter. If power comprising an AC voltage is supplied to luminaire 50, the power supply/converter 68 can convert the AC power and supplies energy to the light engine 62 in a form compatible with driving LED chips 64 so that they emit light. The power converter can also be arranged to provide drive signals to different groups of the LED chips 64, with the emission of at least some of the LED chips being varied under control of the power supply/converter. These control signals can be provided using known electronic components and circuitry, and the varying of the emission of some of the LED chips can be manually or electronically controlled.

In this embodiment, the diffuser 66 can be designed to promote effective color mixing, depixelization, and high optical efficiency. The diffuser 66 can be attached to the housing 52 via mechanical snap-fit to the lower housing in such a manner that it requires the device to be uninstalled (powered down) to remove it, and/or the diffuser (lens) can be permanently attached (i.e., removal would require breakage), e.g., by heat staking, suitable heat staking techniques being well-known in the art.

Figure 5:
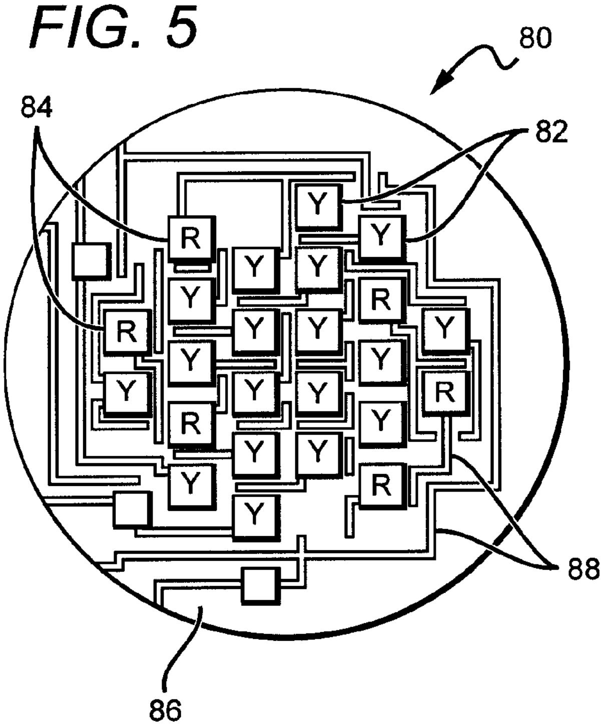
FIG. 5 is a plan view of one embodiment of an SSL luminaire light engine according to the present invention.

FIG. 5 shows one embodiment of a light engine 80 according to the present invention that can comprise a plurality of LED chips emitting light that mixes to provide the desired emission characteristics for the light engine 80. The light engine 80 can comprise different types of LEDs, and in the embodiment shown it can include a plurality of BSY LED chips 82 and a plurality red emitting LED chips 84. It is understood that other light engine embodiments can have fewer or more of these LED chips types and in still other embodiments different types of LED chips can be used.

As described above, the BSY LED chips 82 can comprise blue LEDs coated by a yellow phosphor, with the yellow phosphor absorbing blue light and emitting yellow light. The blue LEDs can be covered with sufficient amount of yellow phosphor such that the desired amount of blue LED light is absorbed by the yellow phosphor, with the BSY LED chips emitting the desired amount of blue light from the LED and yellow light from the phosphor. Many different blue LEDs can be used in the BYS LED chips 82 that can be made of many different semiconductor materials, such as materials from the Group-III nitride material system. LED structures, features, and their fabrication and operation are generally known in the art and accordingly are not discussed herein.

Many different yellow phosphors can be used in the BSY LED chips 82 such as commercially available YAG:Ce phosphors, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Some additional yellow phosphors that can be used in LED chips 82 can include:
$Tb_{3-x}RE_xO_{12}$:Ce (TAG); RE=Y, Gd, La, Lu; or
$Sr_{2-x-y}Ba_xCa_ySiO_4$:Eu.

The blue LEDs in the BSY LED chips 82 can be coated with the yellow phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LED chips can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that other conventional coating methods can be used, including but not limited to spin coating.

The light engine can comprise many different conventional red emitting LEDs chips 84 such as red emitting AlInGaP based LED chips. The red emitting LED chips 84 can also comprise an LED coated by a red conversion material such as a red phosphor. The red LED chips 84 can comprise different LEDs with some embodiments comprising blue or ultraviolet (UV) emitting LED, although it is understood that LED emitting different colors can also be used. In these embodiments, the LEDs can be covered by a red phosphor in an amount sufficient to absorb the LED light and re-emit red light. Many different phosphors can be used in the LEDs chips 84, including but not limited to:
$Lu_2O_3:Eu^{3+}$
$(Sr_{2-x}La_x)(Ce_{1-x}Eu_x)\ O_4$
$Sr_2Ce_{1-x}Eu_xO_4$
$Sr_{2-x}Eu_xCeO_4$
$SrTiO_3:Pr^{3+}$, $Ga^{3+}$
$CaAlSiN_3:Eu^{2+}$
$Sr_2Si_5N_8:Eu^{2+}$ The LEDs used in LED chips 84 can also be fabricated using known methods such as those used for to fabricate LED chips 84 and can be coated using the methods described above.

For both the BSY and red LED chips 82, 84 different factors determine the amount of LED light that can be absorbed by the yellow and red conversion materials, and accordingly determines the necessary amount of conversion material needed in each. Some of these factors include but are not limited to the size of the phosphor particles, the type of binder material, the efficiency of the match between the type of phosphor and wavelength of emitted LED light, and the thickness of the phosphor/binding layer.

Different sized phosphor particles can also be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. The phosphors in the LED chips 82, 84 can also have different concentrations or loading of phosphor materials in the binder, with a typical concentration being in range of 30-70% by weight. In some embodiments, the phosphor concentration can be approximately 65% by weight, and can be uniformly dispersed throughout the phosphor coatings, although it is understood that in some embodiments it can be desirable to have phosphors in different concentrations in different regions. The appropriate thickness of the phosphor coating over the LEDs in the control and variable groups of LED chips 82, 84 can be determined by taking into account the above factors in combination with the luminous flux of the particular LEDs.

Referring again to FIG. 5, the BSY and red LED chips 82, 84 can be mounted to a submount, substrate or printed circuit board (PCB) 86 ("submount") that can have conductive traces 88 that can connect the LED chips in different serial and parallel arrangements. The submount 86 can be formed of many different materials with a preferred material being electrically insulating, such as a dielectric. The submount 86 can also comprise ceramics such as alumina, aluminum nitride, silicon carbide, or a polymeric material such as polyimide and polyester etc. In some embodiments the submount 86 can comprise a material having a high thermal conductivity such as with aluminum nitride and silicon carbide. In other embodiments the submount 86 can comprise highly reflective material, such as reflective ceramic or metal layers like silver, to enhance light extraction from the component. In other embodiments the submount 86 can comprise a printed circuit board (PCB), sapphire, silicon carbide or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. The size of the submount 86 can vary depending on different factors, with one being the size and number of LED chips 82, 84.

The submount 86 can also comprise die pads that along with the conductive traces 88 can be many different materials such as metals or other conductive materials. In one embodiment they can comprise copper deposited using known techniques such as plating and can then be patterned using standard lithographic processes. In other embodiments the layer can be sputtered using a mask to form the desired pattern. In some embodiments according to the present invention some of the conductive features can include only copper, with others including additional materials. For example, the die pads can be plated or coated with additional metals or materials to make them more suitable for mounting of LED chips. In one embodiment the die pads can be plated with adhesive or bonding materials, or reflective and barrier layers. The LED chips can be mounted to the die pads using known methods and materials such as using conventional solder materials that may or may not contain a flux material or dispensed polymeric materials that may be thermally and electrically conductive. In some embodiments wire bonds can be included, each of which passes between one of the conductive traces 88 and one of the LED chips 82, 84 and in some embodiments an electrical signal is applied to the LED chips 82, 84 through its respective one of the die pads and the wire bonds.

As discussed above, the desired emission of the light engine 80 can be provided with the combined emission of the LED chips 82, 84 but as also mentioned above the emission intensity of some of the emitters can vary with temperature or can vary over time. For example the emission intensity of red AlInGaP LEDs can vary with temperature and can depreciate over time. Other LED types can similarly emit varying intensities at different temperatures and over time. To compensate for these changes, SSL luminaires can include complex and expensive compensation circuitry to provide varying LED drive signals corresponding to the varying LED emissions. To reduce the cost and complexity of the compensation circuitry, the SSL luminaires according to the present invention can utilize memristors to compensate for varying emissions. As discussed above, memristors can comprise a variable resistance to vary the drive signal applied to one the LED chips.

Figure 6:
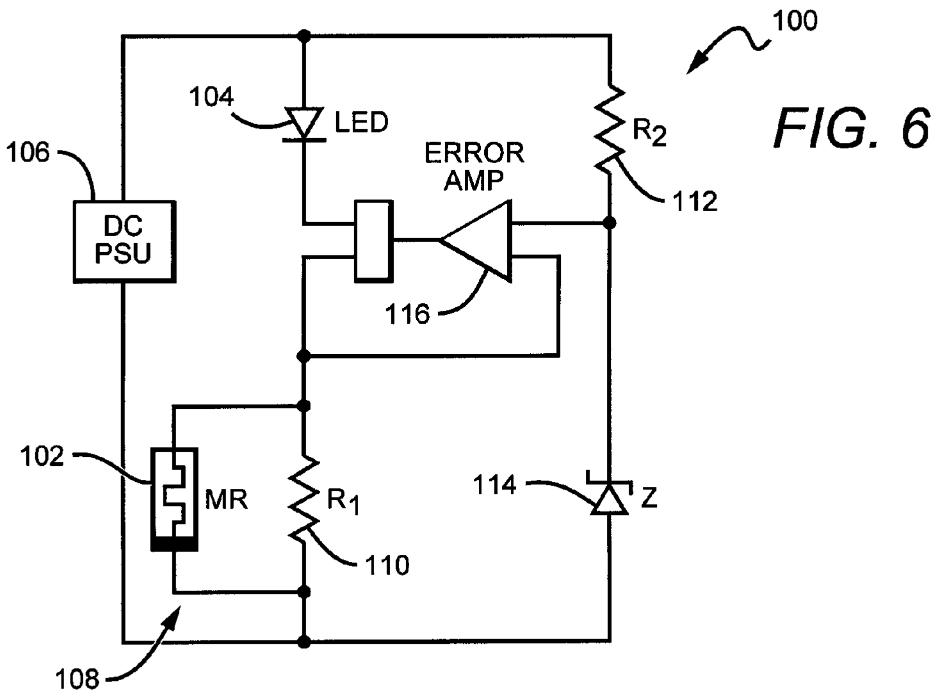
FIG. 6 is a schematic of one embodiment of one embodiment of an LED chip circuit utilizing a memristor according to the present invention.

FIG. 6 shows one embodiment of an LED chip drive circuit 100 according to the present invention arranged with a memristor 102 to compensate for emission variations from LED chip 104. The circuit is shown with a single LED chip 104 for ease of description, but it is understood that circuits according to the present invention can have multiple LED chips or can have multiple memristor arrangements. For example, the circuit 100 can comprise an array of LED chips with more than one LED chip coupled to a memristor 102 either in series or parallel arrangements, or in a series-parallel combination. In other embodiments, each of the LED chips can have its own memristor or there can be combinations of memristors with multiple LED chips and memristors with only one LED chip.

The circuit 100 can comprise a direct current power supply unit (DC PSU) 106 that corresponds to or is part of the power supply/converter 68 described above. The DC PSU is arranged to convert AC power and supplies energy to the LED chip 104 in a form compatible with driving LED chip 104, such as in a direct current form. The circuit comprises a parallel resistor circuit 108 coupled to the one terminal of the LED chip 104, with the resistor circuit comprising a first resistor ($R_1$) 110 coupled in parallel with the memristor 102. A second resistor ($R_2$) 112, zener diode 114, and error amplifier 116 are also coupled to the LED chip 104 in a conventional manner as shown.

In different embodiments, the memristor 102 can be arranged to increase or decrease its resistance to vary the drive signal applied to the LED chip 104. In the embodiment shown, arranging a memristor 102 across the first resistor 110 causes the combined resistance of the resistor circuit 108 to decrease over time with a decrease in the resistance of the memristor 102 over time. That is, the resistance of the memristor 102 will change over time while the resistance of the first resistor 110 remains substantially constant, with the combined resistance decreasing. As the combined resistant of the resistor circuit 108 decreases, the current driving the LED chip 104 increases, which in turn increases the emission intensity of the LED chip. This resistor circuit 108 and its memristor 102 combination can be arranged to increase current to the LED chip 104 to compensate for lower emission due to temperature or emission deprecation over time. This is particularly applicable to LED chips such as red AlInGaP LEDs whose emission can vary with temperature and can depreciate over time.

Figure 7:
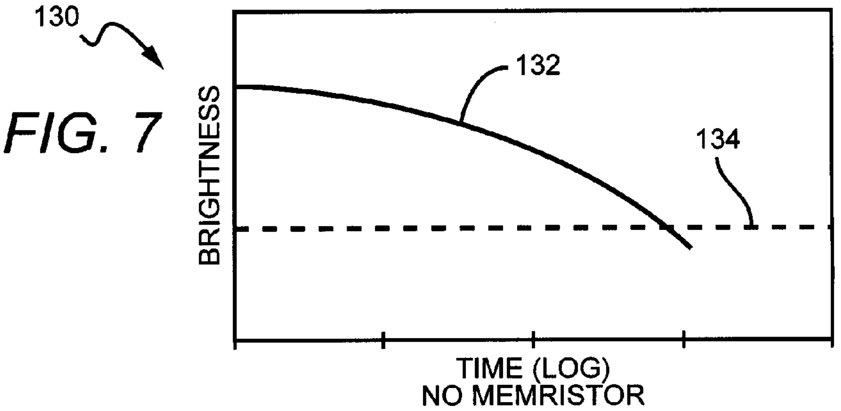
FIG. 7 is a graph showing the emission characteristics over time for a conventional LED chip circuit.

FIG. 7 is a graph 130 showing LED chip emission intensity 132 and LED drive current 134 over time for a conventional LED chip drive circuit arrangement not having a memristor arrangement to vary the drive signal to the LED chip. The LED drive current 134 remains constant over time, while the LED chip emission intensity decreases over time, such as for a red AlInGaP LED chip. This decrease in emission intensity can cause and undesirable shift in emission from the luminaires utilizing red LED chips.

Figure 8:
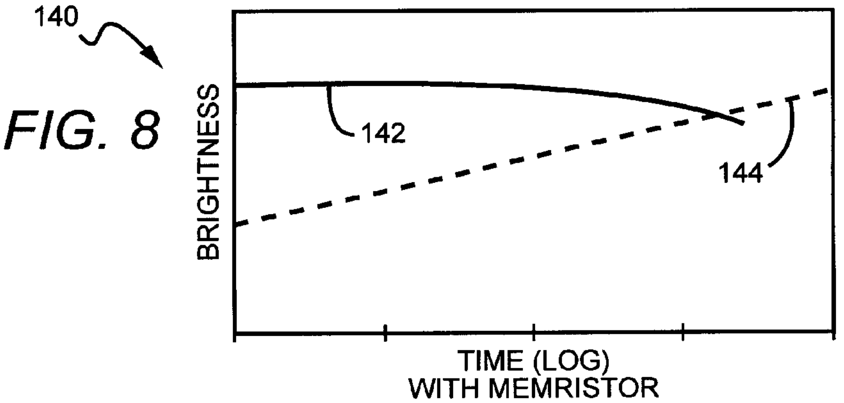
FIG. 8 is graph showing the emission characteristics for a chip circuit utilizing a memristor according to the present invention.

FIG. 8 shows a similar graph 140 for an LED drive circuit embodiment according to the present invention utilizing a memristor arrangement similar to the one shown in FIG. 6. The graph 140 is for a circuit embodiment driving an LED chip that is the same as or similar to the LED chip in FIG. 7, such as a red AlInGaP LED chip. The LED drive current 144 increases over time based on the changes to the resistance in the resistor circuit 108 described above. This change in drive current is designed to compensate for depreciation in the LED chip emission intensity over time such that the LED chip emission intensity 142 of the LED chips remains substantially constant over time. In some embodiments, the LED chip can experience some reduction in emission intensity over time, but at a much slower rate than LED chips with conventional drive circuits.

FIG. 9 shows another embodiment of an LED circuit 160 according to the present invention comprising a first LED chip 162 connected in series with a second LED chip 164 connected in series. Like the embodiment shown, above the LED circuit 162 is shown with only two LED chips but it is understood that the circuit can also be used with an array of LED chips utilizing a single memristor or multiple memristors in different arrangements.

Many different first and second LED chips can be used in the circuit 160, and in the embodiment shown the first LED chip 162 can comprise a BSY LED chip and the second LED chip 164 can comprise a red LED chip. As mentioned above, the brightness of red LED chips can depreciate faster than other types of LED chips. To compensate for this different rate of emission depreciation, a memristor 166 can be coupled across the first LED chip 162. The memristor 166 provides a path that allows some current to bypass the first (BSY) LED chip 162, and the amount of the bypass current depends on the resistance of the memristor 166.

As the resistance of the memristor 166 decreases over time, the amount of bypassing current increases. This in turn increases the amount of current passing into the second (red) LED 164. Accordingly, as the emission of the second (red) LED 164 depreciates over time the current passing through the second LED 164 increases. This maintains the emission intensity of the second LED 164 in relation to the emission intensity of the first LED 164 such that the color mixture is maintained even though the combined emission intensity of the first and second LEDs 162, 164 decreases.

FIG. 10 is a graph 180 showing the first (BSY) LED chip emission intensity 182 over time and the second (red) LED chip emission intensity 184 over time. These can correspond to first and second LED chips connected in series without a memristor as shown in FIG. 9. Both the first LED chip emission intensity 182 and the second LED chip emission intensity 184 decrease over time, with the second LED chip emission intensity 184 decreasing at a faster rate that the first. This is shown by the color difference line 186 that is shown increasing over time. This reflects that the difference in emission intensities between the first and second emitters increases over time.

FIG. 11 is a graph 200 showing the emission intensities for serial connected BSY and red LED chips emitters having the memristor arranged across the first LED chip as shown in FIG. 9. The graph 200 shows the emission intensity of the first (BSY) LED chip 202 and the second (red) LED chip 204 over time. By having the memristor arranged across the BSY LED chip, more current bypasses the first (BSY) LED chip which in turn increases the amount of current passing through the second (red) LED chip. This arrangement reduces the amount of current passing through the first (BSY) LED chip while at the same time increasing the amount of current passing through the second (red) LED chip. This helps increase and boost the emission intensity of the second (red) LED chip, while reducing the emission intensity of the first (blue) LED chip. As shown in graph 200, this helps maintain the relative emission intensities of the first and second LED chips so that the color combination of light from the LED chips is maintained even though the overall brightness may reduce over time. This is shown by color different line 206 showing that the emission intensity if the different colors are maintained over time, even as the overall brightness of the emitters reduces.

FIG. 12 shows another embodiment of an LED chip circuit comprising a memristor bypass circuit 220 that can be used in a way similar to the LED circuit in FIG. 9. The circuit 220 can comprise a memristor 222, a resistor 224, and a transistor 226 arranged to amplify the memristor effect. The circuit 220 utilized in a circuit having first and second LED chips coupled in series, with the circuit coupled across one of the LED chips similar to the arrangement in FIG. 9. In one embodiment the circuit 220 can be coupled across a first BSY LED chip that is coupled in series with red LED chip. The circuit 220 allows for increasing amounts of current to bypass the BSY LED chip so that more passes through the red LED chip. The circuit 220 also amplifies the change in current provided by the changing resistance of the memristor 222 which provides a larger current bypass in proportion to the memristor resistance change.

The different embodiments above show the memristors coupled in different drive circuits with a memristor coupled directly to or in close proximity to a LED chip. In some of these embodiments, the LED drive current can pass through the memristor, which can cause the change in resistance of the memristor. This change in resistance can then result in a different LED chip drive current.

In other embodiments according to the present invention, the memristor may not be directly coupled to the LED and may not change in the memristor resistance may not directly result in a change in the LED drive current. Instead, the memristor can be arranged in a remote fashion such that its change in resistance does not directly affect LED current. In these embodiments, a DC current can be applied to the memristor as the LED chip is being driven, with the memristor resistance being set or changed in response to the DC current as described above. A drive circuit can be provided that utilizes the resistance of the memristor and can vary the drive current to the LED chip in response to changes in the memristor resistance. Accordingly, as the memristor resistance value changes or is set with the DC current applied to it, the drive current to the LED chip can change. In this embodiment, the change in memristor resistance is not directly causing the change in drive current, but it instead causes the change through a drive circuit, which produces different drive currents based on the memristor resistance.

In some embodiments, the DC current applied to the memristor can be the same as the drive current applied to the LED chip, while in other embodiments it can be proportional to the LED chip drive current. The DC current applied to the memristor can also be produced based on LED chip drive current, or can be produced independently.

These are only some of the many different arrangements according to the present invention where the memristor resistance does not directly result in changes in the LED chip drive current.

The above embodiments show only some of the many different memristor arrangements that can be utilized according to the present invention. In other embodiments different memristors can be provided for different LED chip types. In still other embodiments, the value of the memristor can be set during manufacturing to match the particular emission characteristics of the LED chips in the luminaires. The different memristor arrangements can also be provided with feedback or control circuitry to either inhibit or induce resistance change in the memristors.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. Therefore, the spirit and scope of the invention should not be limited to the versions described above.

I claim:

1. A circuit, comprising:
a light emitting diode (LED);
a memristor coupled to the LED; and
a resistor connected in parallel with said memristor and coupled to the LED, in which a change in a resistance of the combination of the memristor and the resistor changes an emission intensity of the LED.

2. The circuit of claim 1, wherein said memristor varies a drive signal applied to said LED.

3. The circuit of claim 1, wherein said emission intensity is varied in response to changes in a resistance of said memristor.

4. The circuit of claim 1, wherein as the emission intensity of said LED varies over time, said memristor varies a drive signal to said LED to compensate for at least a portion of said variation of the emission intensity.

5. The circuit of claim 1, wherein as the emission intensity of said LED depreciates over time, said memristor increases a drive signal to said LED to compensate for at least a portion of said depreciation of the emission intensity.

6. The circuit of claim 1, wherein as the emission intensity of said LED varies with operating temperature, said memristor varies a drive signal to said LED to compensate for at least a portion of said variation in operating temperature.

7. The circuit of claim 1, wherein said memristor increases a drive signal applied to said LED over time.

8. The LED chip circuit of claim 1, wherein said resistor is a thermistor.

9. A light emitting diode (LED) chip circuit, comprising:
an LED chip; and
a resistor circuit, coupled to said LED chip, comprising a memristor in parallel with a resistor;
wherein a change in a resistance of said memristor changes a resistance of said resistor circuit.

10. The LED chip circuit of claim 9, wherein said resistor circuit is coupled to a red emitting LED chip.

11. A light emitting diode (LED) chip circuit, comprising:
an LED chip; and a bypass circuit, coupled to said LED chip, the bypass circuit comprising a memristor in parallel with a resistor to vary an emission intensity of said LED chip.

12. The LED chip circuit of claim 11, further comprising a second LED hip in series with said LED chip, said bypass circuit coupled across said LED chip.

13. The LED chip circuit of claim 12, wherein a decrease in resistance from said memristor causes an increase in current bypassing said LED chip through said bypass circuit.

14. The LED chip circuit of claim 13, wherein said LED chip is a Blue-Shifted Yellow (BSY) emitting LED chip and said second LED chip is a red emitting LED chip.

15. A solid state luminaire comprising:

a first light emitting diode (LED) chip having at least one of a time-varying emission intensity and a temperature-dependent emission intensity;

a memristor to vary a drive signal applied to said first LED chip to compensate for said emission changes; and a resistor connected in parallel with said memristor.

16. The solid state luminaire of claim 15, wherein a resistance of said memristor is varied to vary said drive signal.

17. The solid state luminaire of claim 15, further comprising a second LED chip, said memristor varying the drive signal to said first LED chip to maintain a desired combination of light from said first and second LED chips.

18. A solid state luminaire comprising:

a first light emitting diode (LED) chip having at least one of a time-varying emission intensity and a temperature-dependent emission intensity; and a resistor circuit coupled to said first LED chip, said resistor circuit comprising a memristor in parallel with resistor to vary a drive signal applied to said first LED chip to compensate for said said at least one of said time-varying emission intensity and said temperature-dependent emission intensity, wherein a change in a resistance of said memristor changes a resistance of said resistor circuit.

19. A solid state luminaire comprising:

a first light emitting diode (LED) chip having at least one of a time-varying emission intensity; and a temperature-dependent emission intensity; and a bypass circuit coupled to said first LED chip, said bypass circuit comprising a memristor in parallel with a resistor to vary a drive signal applied to said first LED chip to compensate for said at least one of said time-varying emission intensity and said temperature-dependent emission intensity.

20. A solid state light engine comprising:

a light emitting diode (LED) chip array comprising at least one first LED chip emitting at one color of light and at least one second LED chip emitting a different color of light than said at least one first LED chip, wherein an emission of said at least one first LED chip and an emission of said at least one second LED chip depreciates over time at different rates;

a memristor coupled to said LED chip array to vary a drive signal applied to said at least one first LED chip to compensate for at least a portion of said different rates of emission depreciation; and a resistor connected in parallel with said memristor.

21. The solid state light engine of claim 20, wherein a resistance of said memristor is varied to vary said drive signal.

22. The solid state light engine of claim 20, wherein said memristor varies the drive signal to said at least one first LED chip to maintain a desired combination of light from said at least one first LED chip and said at least one second LED chip.

23. A solid state luminaire, comprising:

a housing comprising a housing opening;

a light engine in said housing with an array of light emitting diode (LED) chips comprising first and second LED chips emitting at different colors of light, the light from said first and second LED chips emitting out said housing opening;

a memristor to vary the emission of at least one of said first and second LED chips over time; and a resistor connected in parallel with said memristor.

24. The solid state luminaire of claim 23, further comprising a mounting mechanism to mount said housing.

25. The solid state luminaire of claim 23, wherein the resistance of said memristor is varied no vary said emission.

26. The solid state luminaire of claim 23, wherein said memristor varies the drive signal to at least one of said first LED chips over time to maintain a desired combination of light from said first and second LED chips.

27. A solid state lighting device, comprising:

a light emitting diode (LED);

a memristor that receives DC current while the LED is being driven by a drive current;

a drive circuit that provides said drive current, said drive circuit responsive to the memristor resistance value and varying the drive current to said LED based on the resistance of said memristor; and a resistor connected in parallel with said memristor.

28. A solid state lighting device, comprising:

a light emitting diode (LED);

a memristor in parallel with a resistor, wherein the parallel combination of said memristor and said resistor receives DC current while the LED is being driven by a drive current; and a drive circuit that provides said drive current, said drive circuit responsive to the memristor resistance value and varying the drive current to said LED based on the resistance of said memristor, wherein the DC current received by said memristor is proportional to said drive current.

29. A solid state lighting device, comprising:

light emitting diode (LED);

a memristor in parallel with a resistor, wherein the parallel combination of said memristor and said resistor receives DC current while the LED is being driven by a drive current; and a drive circuit that provides said drive current, said drive circuit responsive to the memristor resistance value and varying the drive current to said LED based on the resistance of said memristor, wherein the resistance of said memristor does not directly cause a change in said drive current.

30. A solid state lighting device, comprising:

a light emitting diode (LED);

a memristor in parallel with a resistor, wherein the parallel combination of said memristor and said resistor receives DC current while the LED is being driven by a drive currents; and a drive circuit that provides said drive current, said drive circuit responsive to the memristor resistance value and varying the drive current to said LED based on the resistance of said memristor, wherein said memristor is remote to said LED.

31. A light-emitting device, comprising:

at least one solid-state light-emitting semiconductor device;

a drive current controller, coupled to the at least one solid-state light-emitting semiconductor device, in which the drive current controller selectively varies the flow of current through the at least one solid-state light-emitting semiconductor device with a memristor in parallel with a resistor.

32. The light-emitting device of claim 31, in which a resistance of the memristor is varied to vary the flow of current through the at least one solid-state light-emitting device.

33. The light-emitting device of claim 32, in which the drive current controller selectively varies the current through the at least one solid-state light-emitting device to at least partially compensate for a depreciation in emission intensity of the at least one solid-state light-emitting device.

34. The light-emitting device of claim 33, in which the drive current controller selectively varies the current through the at least one solid-state light-emitting device to at least partially compensate for an operating temperature variation in the at least one solid-state light-emitting device.

35. The light-emitting device of claim 34, in which the drive current controller is in series with the at least one solid-state light-emitting device.

36. The light-emitting device of claim 31, in which the drive current controller is in series with the at least one solid-state light-emitting device.

* * * * *